(12) United States Patent
Brask et al.

(10) Patent No.: US 10,937,907 B2
(45) Date of Patent: Mar. 2, 2021

(54) METHOD FOR FABRICATING TRANSISTOR WITH THINNED CHANNEL

(71) Applicant: INTEL CORPORATION, Santa Clara, CA (US)

(72) Inventors: Justin K. Brask, Portland, OR (US);
Robert S. Chau, Beaverton, OR (US);
Suman Datta, Beaverton, OR (US);
Mark L. Doczy, Beaverton, OR (US);
Brian S. Doyle, Portland, OR (US);
Jack T. Kavalieros, Portland, OR (US);
Amlan Majumdar, Portland, OR (US);
Matthew V. Metz, Hillsboro, OR (US);
Marko Radosavljevic, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/526,898

(22) Filed: Jul. 30, 2019

(65) Prior Publication Data

US 2019/0371940 A1 Dec. 5, 2019

Related U.S. Application Data

(60) Continuation of application No. 15/730,542, filed on Oct. 11, 2017, now Pat. No. 10,367,093, which is a
(Continued)

(51) Int. Cl.
*H01L 29/00* (2006.01)
*H01L 29/78* (2006.01)
(Continued)

(52) U.S. Cl.
CPC ...... *H01L 29/7848* (2013.01); *H01L 29/0649* (2013.01); *H01L 29/0847* (2013.01);
(Continued)

(58) Field of Classification Search
CPC .............................. H01L 29/785; H01L 21/84
See application file for complete search history.

(56) References Cited

U.S. PATENT DOCUMENTS 4,711,701 A 12/1987 McLevige
5,266,518 A 11/1993 Binsma et al.
(Continued)

FOREIGN PATENT DOCUMENTS

DE 10203998 8/2003
EP 0623963 11/1994
(Continued)

OTHER PUBLICATIONS

Final Office Action for U.S. Appl. No. 11/154,138, dated Dec. 8, 2009, 12 pages.
(Continued)

*Primary Examiner* — Caridad Everhart
*Assistant Examiner* — Ankush K Singal
(74) *Attorney, Agent, or Firm* — Green, Howard & Mughal LLP

(57) ABSTRACT

A method of fabricating a MOS transistor having a thinned channel region is described. The channel region is etched following removal of a dummy gate. The source and drain regions have relatively low resistance with the process.

20 Claims, 9 Drawing Sheets

Related U.S. Application Data continuation of application No. 15/069,726, filed on Mar. 14, 2016, now Pat. No. 9,806,195, which is a division of application No. 12/949,696, filed on Nov. 18, 2010, now Pat. No. 9,337,307, which is a continuation of application No. 11/154,138, filed on Jun. 15, 2005, now Pat. No. 7,858,481.

(51) Int. Cl.

| | | |
|---|---|---|
| *H01L 29/423* | (2006.01) | |
| *H01L 29/66* | (2006.01) | |
| *H01L 29/06* | (2006.01) | |
| *H01L 29/08* | (2006.01) | |
| *H01L 29/10* | (2006.01) | |
| *H01L 29/161* | (2006.01) | |
| *H01L 29/165* | (2006.01) | |
| *H01L 29/24* | (2006.01) | |
| *H01L 29/267* | (2006.01) | |
| *H01L 29/49* | (2006.01) | |
| *H04B 1/3827* | (2015.01) | |

(52) U.S. Cl.
CPC ........ *H01L 29/1033* (2013.01); *H01L 29/161* (2013.01); *H01L 29/165* (2013.01); *H01L 29/24* (2013.01); *H01L 29/267* (2013.01); *H01L 29/4236* (2013.01); *H01L 29/42376* (2013.01); *H01L 29/4966* (2013.01); *H01L 29/66545* (2013.01); *H01L 29/66621* (2013.01); *H01L 29/66628* (2013.01); *H01L 29/7834* (2013.01); *H01L 29/7838* (2013.01); *H04B 1/3827* (2013.01); *H01L 29/66636* (2013.01); *H01L 29/66818* (2013.01); *H01L 29/785* (2013.01); *Y10S 438/926* (2013.01)

(56) References Cited

U.S. PATENT DOCUMENTS

| | | | |
|---|---|---|---|
| 5,371,024 | A | 12/1994 | Hieda et al. |
| 5,576,227 | A | 11/1996 | Hsu |
| 5,693,542 | A | 12/1997 | Suh et al. |
| 5,724,297 | A * | 3/1998 | Noda .............. G11C 5/14 365/226 |
| 5,747,356 | A | 5/1998 | Lee et al. |
| 5,814,544 | A | 9/1998 | Huang |
| 5,856,225 | A | 1/1999 | Lee et al. |
| 5,889,304 | A | 3/1999 | Watanabe et al. |
| 5,908,313 | A | 6/1999 | Chau et al. |
| 5,953,602 | A * | 9/1999 | Oh ................ H01L 29/42336 257/E21.422 |
| 5,985,726 | A | 11/1999 | Yu et al. |
| 5,994,747 | A | 11/1999 | Wu |
| 6,010,921 | A | 1/2000 | Soutome |
| 6,054,355 | A | 4/2000 | Inumiya et al. |
| 6,087,208 | A | 7/2000 | Krivokapic et al. |
| 6,093,947 | A | 7/2000 | Hanafi et al. |
| 6,114,206 | A | 9/2000 | Yu |
| 6,117,741 | A | 9/2000 | Chatterjee et al. |
| 6,124,177 | A | 9/2000 | Lin |
| 6,130,454 | A | 10/2000 | Gardner |
| 6,163,053 | A | 12/2000 | Kawashima |
| 6,200,865 | B1 | 3/2001 | Gardner et al. |
| 6,251,763 | B1 | 6/2001 | Inumiya et al. |
| 6,262,456 | B1 | 7/2001 | Yu et al. |
| 6,297,117 | B1 * | 10/2001 | Yu ................ H01L 21/26506 438/305 |
| 6,319,807 | B1 | 11/2001 | Yeh et al. |
| 6,346,450 | B1 | 2/2002 | Deleonibus et al. |
| 6,358,800 | B1 | 3/2002 | Tseng |
| 6,452,229 | B1 | 9/2002 | Krivokapic |
| 6,465,290 | B1 | 10/2002 | Suguro et al. |
| 6,479,866 | B1 | 11/2002 | Xiang |
| 6,483,151 | B2 | 11/2002 | Wakabayashi et al. |
| 6,490,646 | B1 | 12/2002 | Leydier |
| 6,509,234 | B1 | 1/2003 | Krivokapic |
| 6,551,886 | B1 | 4/2003 | Yu |
| 6,562,665 | B1 | 5/2003 | Yu |
| 6,562,687 | B1 | 5/2003 | Deleonibus et al. |
| 6,566,734 | B2 | 5/2003 | Sugihara et al. |
| 6,605,498 | B1 | 8/2003 | Murthy et al. |
| 6,630,388 | B2 | 10/2003 | Sekigawa et al. |
| 6,642,090 | B1 | 11/2003 | Fried et al. |
| 6,660,598 | B2 | 12/2003 | Hanafi et al. |
| 6,764,884 | B1 * | 7/2004 | Yu .................... H01L 29/42392 257/E21.444 |
| 6,787,424 | B1 | 9/2004 | Yu |
| 6,841,831 | B2 | 1/2005 | Hanafi et al. |
| 6,852,559 | B2 | 2/2005 | Kwak et al. |
| 6,876,042 | B1 * | 4/2005 | Yu .................... H01L 29/66795 257/347 |
| 6,881,635 | B1 | 4/2005 | Chidambarrao |
| 6,885,072 | B1 | 4/2005 | Jeng |
| 6,888,181 | B1 | 5/2005 | Liao et al. |
| 6,909,151 | B2 | 6/2005 | Hareland et al. |
| 6,970,373 | B2 | 11/2005 | Datta et al. |
| 7,029,958 | B2 | 4/2006 | Tabery et al. |
| 7,033,869 | B1 | 4/2006 | Xiang et al. |
| 7,041,601 | B1 | 5/2006 | Yu et al. |
| 7,067,361 | B2 | 6/2006 | Allen et al. |
| 7,193,279 | B2 | 3/2007 | Doyle et al. |
| 7,211,864 | B2 | 5/2007 | Seliskar |
| 7,214,993 | B2 | 5/2007 | Yang |
| 7,309,626 | B2 | 12/2007 | Ieong et al. |
| 7,615,429 | B2 | 11/2009 | Kim et al. |
| 7,704,833 | B2 | 4/2010 | Lindert et al. |
| 8,193,582 | B2 | 6/2012 | Matsubara |
| 8,278,164 | B2 | 10/2012 | Li et al. |
| 8,502,351 | B2 | 8/2013 | Shah et al. |
| 2001/0019886 | A1 | 9/2001 | Bruce et al. |
| 2001/0026985 | A1 | 10/2001 | Kim et al. |
| 2001/0028067 | A1 | 10/2001 | Awano |
| 2001/0033000 | A1 | 10/2001 | Mistry |
| 2001/0040907 | A1 | 11/2001 | Chakrabarti |
| 2002/0011612 | A1 | 1/2002 | Hieda |
| 2002/0036290 | A1 | 3/2002 | Inaba et al. |
| 2002/0037619 | A1 | 3/2002 | Sugihara et al. |
| 2002/0048918 | A1 | 4/2002 | Grider et al. |
| 2002/0058374 | A1 | 5/2002 | Kim et al. |
| 2002/0074614 | A1 | 6/2002 | Furuta et al. |
| 2002/0081794 | A1 | 6/2002 | Ito |
| 2002/0096724 | A1 | 7/2002 | Liang et al. |
| 2002/0142529 | A1 | 10/2002 | Matsuda et al. |
| 2002/0149031 | A1 | 10/2002 | Kim et al. |
| 2002/0166838 | A1 | 11/2002 | Nagarajan |
| 2002/0167007 | A1 | 11/2002 | Yamazaki et al. |
| 2003/0001205 | A1 | 1/2003 | Kim et al. |
| 2003/0042542 | A1 | 3/2003 | Maegawa et al. |
| 2003/0057486 | A1 | 3/2003 | Gambino et al. |
| 2003/0080384 | A1 | 5/2003 | Takahashi et al. |
| 2003/0085194 | A1 | 5/2003 | Hopkins, Jr. |
| 2003/0098479 | A1 | 5/2003 | Murthy et al. |
| 2003/0098488 | A1 | 5/2003 | O'Keeffe et al. |
| 2003/0102497 | A1 | 6/2003 | Fried et al. |
| 2003/0111686 | A1 | 6/2003 | Nowak |
| 2003/0143791 | A1 | 7/2003 | Cheong et al. |
| 2003/0162358 | A1 | 8/2003 | Hanafi et al. |
| 2003/0183877 | A1 | 10/2003 | Yagishita |
| 2003/0190766 | A1 | 10/2003 | Gonzalez et al. |
| 2004/0007724 | A1 | 1/2004 | Murthy et al. |
| 2004/0026736 | A1 | 2/2004 | Grupp et al. |
| 2004/0036126 | A1 * | 2/2004 | Chau ................ H01L 29/66795 257/401 |
| 2004/0036127 | A1 | 2/2004 | Chau et al. |
| 2004/0063286 | A1 | 4/2004 | Kim et al. |
| 2004/0075141 | A1 | 4/2004 | Maeda et al. |
| 2004/0094807 | A1 | 5/2004 | Chau et al. |
| 2004/0108558 | A1 | 6/2004 | Kwak et al. |
| 2004/0142524 | A1 | 7/2004 | Grupp et al. |
| 2004/0188760 | A1 | 9/2004 | Skotnicki |
| 2004/0195624 | A1 | 10/2004 | Liu et al. |
| 2004/0197975 | A1 | 10/2004 | Krivokapic et al. |

(56) References Cited

U.S. PATENT DOCUMENTS

| | | |
|---|---|---|
| 2004/0212014 A1 | 10/2004 | Fujito et al. |
| 2004/0217408 A1 | 11/2004 | Hofmann |
| 2004/0219722 A1 | 11/2004 | Pham et al. |
| 2005/0003612 A1 | 1/2005 | Hackler, Sr. et al. |
| 2005/0017377 A1 | 1/2005 | Joshi et al. |
| 2005/0023535 A1 | 2/2005 | Sriram |
| 2005/0048752 A1 | 3/2005 | Doris et al. |
| 2005/0059194 A1 | 3/2005 | Lee |
| 2005/0093075 A1 | 5/2005 | Bentum et al. |
| 2005/0104055 A1 | 5/2005 | Kwak et al. |
| 2005/0116289 A1* | 6/2005 | Boyd ............... H01L 29/66545 257/347 |
| 2005/0121703 A1 | 6/2005 | Hieda et al. |
| 2005/0156171 A1 | 7/2005 | Brask et al. |
| 2005/0156202 A1 | 7/2005 | Rhee et al. |
| 2005/0158934 A1 | 7/2005 | Yun |
| 2005/0170104 A1 | 8/2005 | Jung et al. |
| 2005/0191795 A1 | 9/2005 | Chidambarrao et al. |
| 2005/0233525 A1 | 10/2005 | Yeo et al. |
| 2005/0263821 A1 | 12/2005 | Cho et al. |
| 2005/0266622 A1 | 12/2005 | Arghavani et al. |
| 2005/0272187 A1 | 12/2005 | Murthy et al. |
| 2005/0272192 A1 | 12/2005 | Oh et al. |
| 2005/0282345 A1 | 12/2005 | Mathew |
| 2005/0285149 A1 | 12/2005 | Chang |
| 2006/0001095 A1 | 1/2006 | Doris et al. |
| 2006/0038241 A1 | 2/2006 | Matsuo |
| 2006/0057792 A1 | 3/2006 | Mathew et al. |
| 2006/0068590 A1 | 3/2006 | Lindert et al. |
| 2006/0068591 A1 | 3/2006 | Radosavljevic et al. |
| 2006/0071275 A1 | 4/2006 | Brask et al. |
| 2006/0071299 A1 | 4/2006 | Doyle et al. |
| 2006/0086977 A1 | 4/2006 | Shah et al. |
| 2006/0091432 A1 | 5/2006 | Guha et al. |
| 2006/0113605 A1 | 6/2006 | Currie |
| 2006/0160312 A1 | 7/2006 | Chaudhary et al. |
| 2006/0172497 A1 | 8/2006 | Hareland et al. |
| 2006/0202266 A1 | 9/2006 | Radosavljevic et al. |
| 2006/0240622 A1 | 10/2006 | Lee et al. |
| 2006/0240625 A1 | 10/2006 | Loechelt |
| 2007/0026591 A1 | 2/2007 | Grupp et al. |
| 2007/0054457 A1 | 3/2007 | Ueno et al. |
| 2007/0108514 A1 | 5/2007 | Inoue et al. |
| 2007/0148937 A1 | 6/2007 | Yagishita et al. |
| 2007/0228473 A1 | 10/2007 | Boyd et al. |
| 2007/0272925 A1 | 11/2007 | Choi et al. |
| 2008/0102586 A1 | 5/2008 | Park |
| 2008/0194092 A1* | 8/2008 | Kaushik ............ H01L 21/28176 438/591 |

FOREIGN PATENT DOCUMENTS

| | | |
|---|---|---|
| JP | 9162301 | 6/1997 |
| JP | 2000037842 | 2/2000 |
| JP | 2001189453 | 7/2001 |
| JP | 2002298051 | 10/2002 |
| JP | 2003229575 | 8/2003 |
| JP | 2003298051 | 10/2003 |
| WO | 2003003442 | 1/2003 |
| WO | 2004059726 | 7/2004 |
| WO | 2005036651 | 4/2005 |

OTHER PUBLICATIONS

Final Office Action for U.S. Appl. No. 11/154,138, dated Feb. 18, 2009.

Final Office Action for U.S. Appl. No. 11/154,138, dated Feb. 18, 2009, 13 pages.

Final Office Action for U.S. Appl. No. 12/949,696, dated Apr. 23, 2013.

Final Office Action for U.S. Appl. No. 12/949,696, dated Aug. 2, 2012.

Final Office Action for U.S. Appl. No. 12/949,696, dated Jun. 10, 2015.

Final Office Action dated Dec. 23, 2016 for U.S. Appl. No. 15/069,726, 17 pages.

Non-Final Office Action for U.S. Appl. No. 11/154,138, dated Aug. 14, 2008, 14 pages.

Non-Final Office Action for U.S. Appl. No. 11/154,138, dated Jun. 23, 2009, 14 pages.

Non-Final Office Action for U.S. Appl. No. 11/154,138, dated Mar. 18, 2008, 16 pages.

Non-Final Office Action for U.S. Appl. No. 12/949,696, dated Feb. 13, 2015.

Non-Final Office Action for U.S. Appl. No. 12/949,696, dated Feb. 15, 2012.

Non-Final Office Action for U.S. Appl. No. 12/949,696, dated May 23, 2014.

Non-Final Office Action for U.S. Appl. No. 12/949,696, dated Nov. 30, 2012.

Non-Final Office Action for U.S. Appl. No. 12/949,696, dated Sep. 16, 2013.

Non-Final Office Action for U.S. Appl. No. 15/730,542, dated Jul. 26, 2018.

Non-Final Office Action dated Aug. 18, 2016 for U.S. Appl. No. 15/069,726.

Notice of Allowance for U.S. Appl. No. 11/154,138, dated Aug. 13, 2010.

Notice of Allowance for U.S. Appl. No. 11/154,138, dated May 5, 2010.

Notice of Allowance for U.S. Appl. No. 12/949,646 dated Dec. 18, 2015.

Notice of Allowance for U.S. Appl. No. 12/949,696, dated Dec. 18, 2015.

Notice of Allowance for U.S. Appl. No. 15/069,726, dated Jul. 10, 2017.

Notice of Allowance from U.S. Appl. No. 16/526,898 notified Feb. 27, 2019, 10 pgs.

* cited by examiner

METHOD FOR FABRICATING TRANSISTOR WITH THINNED CHANNEL

CROSS-REFERENCE TO RELATED APPLICATIONS

This application is a Continuation of, and claims priority to U.S. patent application Ser. No. 15/730,542, filed on Oct. 11, 2017, issued as U.S. Pat. No. 10,367,093 on Jul. 30, 2019, which is a Continuation of, and claims priority to U.S. patent application Ser. No. 15/069,726, filed on Mar. 14, 2016, issued as U.S. Pat. No. 9,806,195 on Oct. 31, 2017, which is a Continuation of, and claims priority to U.S. patent application Ser. No. 12/949,696, filed on Nov. 18, 2010, issued as U.S. Pat. No. 9,337,307, on May 10, 2016, which is a Divisional of, and claims priority to U.S. patent application Ser. No. 11/154,138, filed on Jun. 15, 2005, issued as U.S. Pat. No. 7,858,481, on 28 Dec. 2010, all of which are incorporated by reference in entirety.

BACKGROUND OF THE INVENTION

1) Field of the Invention

The invention relates to the field of semiconductor processing for transistors having thin channel regions.

2) Description of Related Art

The trend in the fabrication of complementary metal-oxide-semiconductor (CMOS) transistors is to have small channel regions. Examples of a transistor having a reduced body which includes the channel region along with a tri-gate structure are shown in US 2004/0036127. Other small channel transistors are delta-doped transistors formed in lightly doped or undoped epitaxial layers grown on a heavily doped substrate. See, for instance, "Metal Gate Transistor with Epitaxial Source and Drain Regions," application Ser. No. 10/955,669, filed Sep. 29, 2004, assigned to the assignee of the present application.

One problem with some of these devices is the generally high external resistance that comes about from the thinning of the source and drain regions, sometimes at the edges of the gates. Other devices have similar problems that result in higher external resistance, such as limited available cross-sectional area for source and drain regions. These problems are discussed in conjunction with FIGS. 1A and 1B.

DETAILED DESCRIPTION

A process for fabricating CMOS field-effect transistors and the resultant transistors are described. In the following description, numerous specific details are set forth, such as specific dimensions and chemical regimes, in order to provide a thorough understanding of the present invention. It will be apparent to one skilled in the art that the present invention may be practiced without these specific details. In other instances, well-known processing steps, such as cleaning steps, are not described in detail, in order to not unnecessarily obscure the present invention.

Figure 1A:
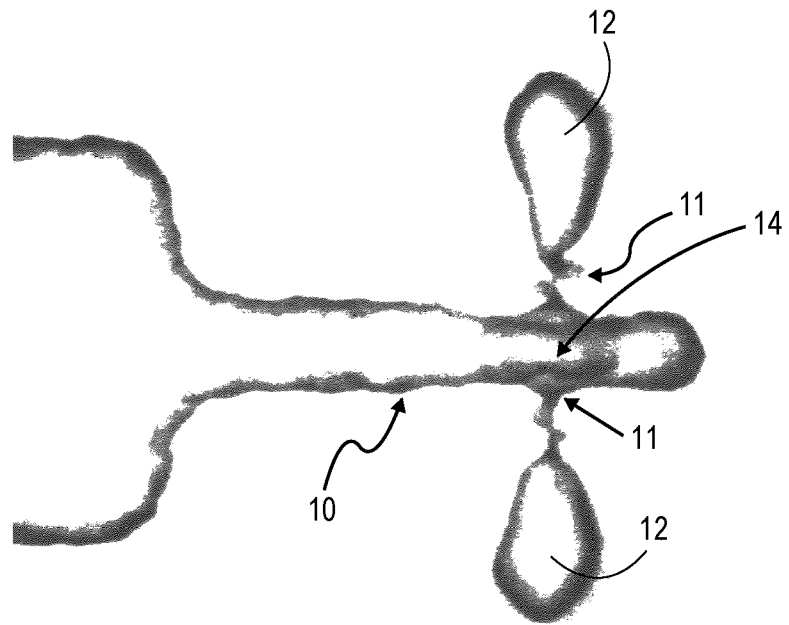
FIG. 1A is a plane view of a prior art transistor taken with a scanning electron microscope.

A problem associated with small body devices is illustrated in FIG. 1A. A tri-gate structure 10 is shown traversing a silicon body at the channel region 14 of a transistor. The semiconductor body or fin has been thinned at the gate edges 11. This thinning is the result of processing used for defining the body, forming spacers, and cleaning of oxides. This processing can so reduce the body such that it may no longer have sufficient silicon seed to support the growth of an epitaxial layer. Often, as much as 20-50% of the body at the edge of the gate can be lost during such processing. In addition to yield loss, this results in higher source/drain resistance and the consequential reduction in transistor performance.

Figure 1B:
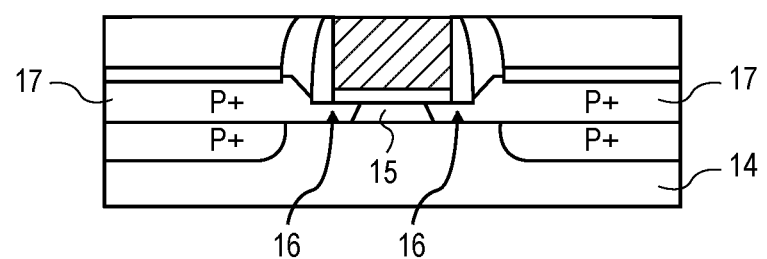
FIG. 1B is a cross-sectional, elevation view of a depletion mode transistor fabricated on a heavily doped substrate. This figure was taken from the patent application cited in the Prior Art and Related Art section of this application.

A similar problem is shown in FIG. 1B, where the n type or intrinsic channel region 15 is formed between the relatively thin regions 16 of the source and drain extension regions of a depletion mode planar transistor. Thus, the problem of thinning at the gate edges is not limited to tri-gate structures, or for that matter, SOI substrates, but can also occur in a bulk silicon layer or a delta-doped transistor, as shown in FIG. 1B. In the structure of FIG. 1B, an epitaxial layer is grown on a heavily doped substrate 14. An etchant discriminates between the epitaxially grown layer and the substrate 14, allowing the channel region 15 to be defined. The source and drain regions 17 are grown following the etching of the region 15. The structure is described in the application referenced in the Prior Art and Related Art section of this application.

Figure 2:
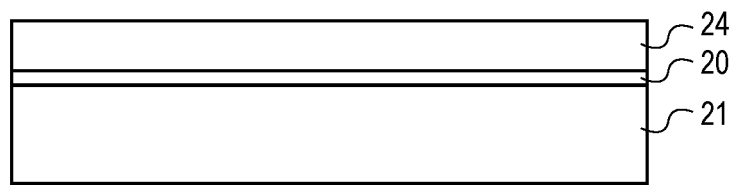
FIG. 2 is a cross-sectional, elevation view of a silicon-on-insulator (SOI) substrate.

In a first embodiment, transistors are fabricated on an oxide layer 20 which is disposed on a silicon substrate 21 shown in FIG. 2. The transistor bodies are fabricated from a monocrystalline, silicon layer 24 disposed on the oxide layer 20. This SOI substrate is well-known in the semiconductor industry. By way of example, the SOI substrate is fabricated by bonding the oxide layer 20 and silicon layer 24 onto the substrate 21, and then planarizing the layer 24 so that it is relatively thin. Other techniques are known for forming an SOI substrate including, for instance, the implantation of oxygen into the silicon substrate to form a buried oxide layer. Other semiconductor materials, other than silicon, may also be used such as gallium arsenide.

The layer 24 may be selectively ion implanted with a p type dopant in regions where n channel transistors are to be fabricated, and with a n type dopant in those regions where p channel devices are to be fabricated. This is used to provide the relatively light doping typically found in the channel regions of MOS devices fabricated in a CMOS integrated circuit.

In the description below, for the first embodiment, the fabrication of a single n channel transistor is described. As will be appreciated in the typical integrated circuit, both n and p channel devices are fabricated. Also, in the processing for the first embodiment, a protective oxide (not shown) is disposed on the silicon layer 24 followed by the deposition of a silicon nitride layer. The nitride layer acts as a hard mask to define silicon bodies such as the silicon body 25 of FIG. 3.

Assume for a particular process that the silicon body, in the channel region of a field-effect transistor, should ideally have a height of 20 nm and a width of 20 nm. Using the prior art processing associated with the transistor of FIG. 1, the thickness of the silicon layer from which the body is etched would also have a thickness of 20 nm. As will be seen for the embodiment of FIGS. 2-11, the layer 24 may initially be thicker than 20 nm, and will subsequently be thinned in the channel region. This thinning only occurs in the channel region, leaving the source and drain regions thicker, thereby reducing the external resistance. This will become more apparent in the description below.

Figure 3:
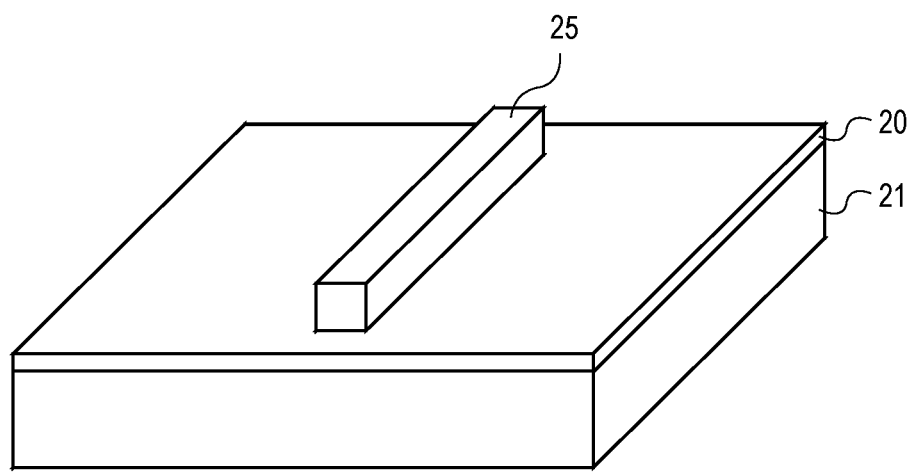
FIG. 3 is a perspective view of the structure of FIG. 2, after the formation of a silicon body, sometimes referred to as a fin.
Figure 4:
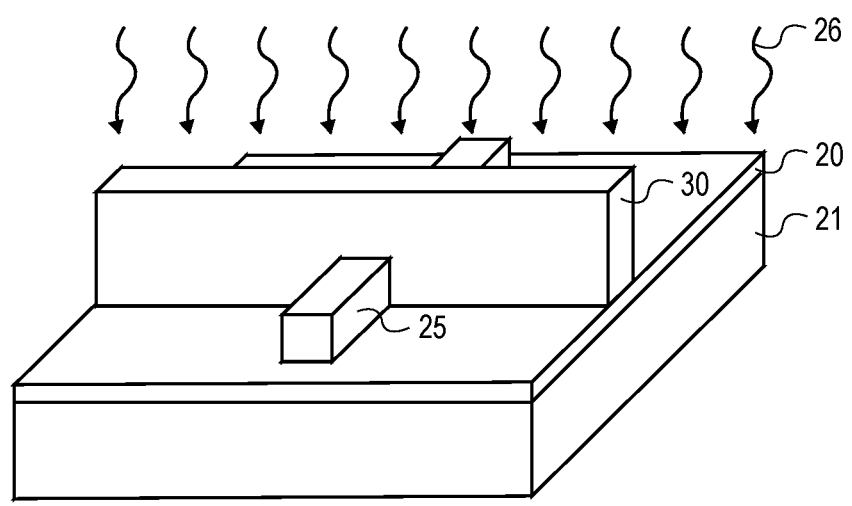
FIG. 4 illustrates the structure of FIG. 3, after a dummy gate is fabricated and during a first ion implantation process.

A polysilicon layer is formed over the structure of FIG. 3 and etched to define a dummy gate 30 which extends over the body 25 as seen in FIG. 4. (A dummy gate oxide which subsequently acts as an etch stop is not shown.) The region of the body 25 below the dummy gate 30, as will be seen, is the channel region for this replacement gate process. Once the dummy gate 30 has been defined, phosphorous or arsenic may be implanted into the body 25 in alignment with the dummy gate, as illustrated by the ion implantation 26. This ion implantation defines the tip or extension source and drain regions frequently used in CMOS transistors.

Figure 5:
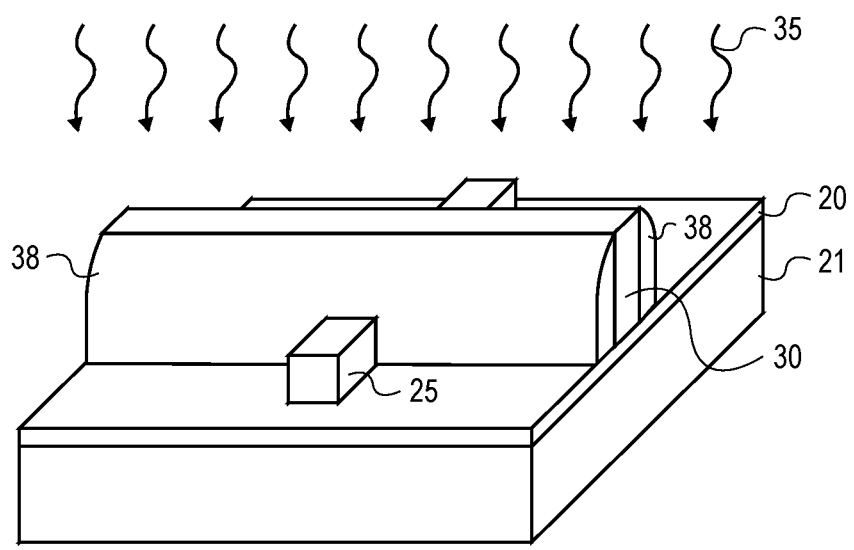
FIG. 5 illustrates the structure of FIG. 4, after spacers are fabricated and during a second ion implantation step.

Next, a layer of silicon nitride is conformally deposited over the structure of FIG. 4, and is used to fabricate the spacers 38 shown in FIG. 5. Ordinary, well-known, anisotropic etching may be used to fabricate the spacers. In one embodiment, a carbon-doped nitride, doped with 5-13% carbon concentration is used for the spacers. As will be discussed later, prior to the formation of the nitride layer, an oxide layer present on the body 25 is removed. This cleaning process is one of the processes that typically reduces the thickness of the body at the edges of the gate. After the spacer formation, the main part of the source and drain regions are formed through ion implantation 35 shown in FIG. 5. For the n channel device, arsenic or phosphorous is used with an implant dose of up to $1 \times 10^{19}$-$1 \times 10^{20}$ atoms/cm$^3$.

Figure 6:
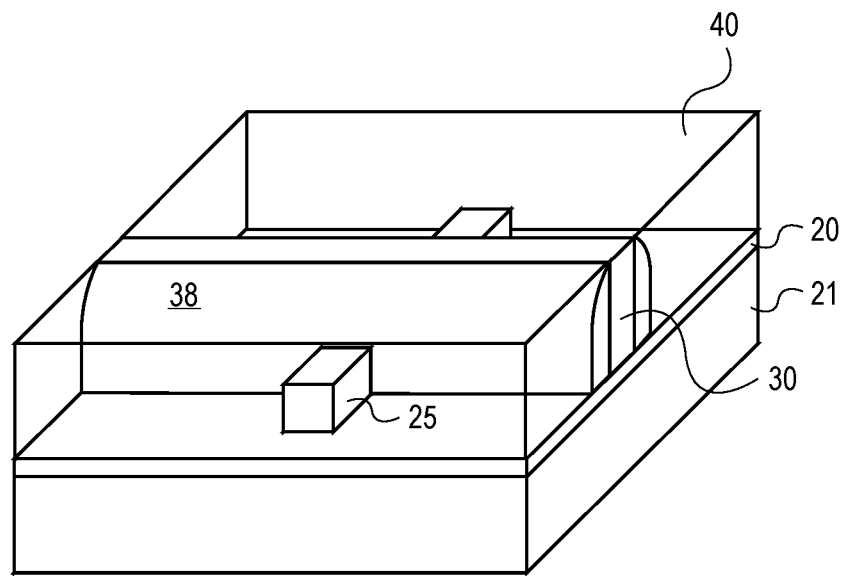
FIG. 6 illustrates the structure of FIG. 5, after forming a dielectric layer.

A dielectric layer 40 is now conformally deposited over the structure of FIG. 5, as shown in FIG. 6. This may comprise a silicon dioxide layer which will become an interlayer dielectric (ILD) in an integrated circuit. A low-k dielectric or a sacrificial dielectric layer may be used. In any event, the layer 40 typically has the mechanical strength to withstand a planarization process such as chemical mechanical polishing (CMP).

Figure 7:
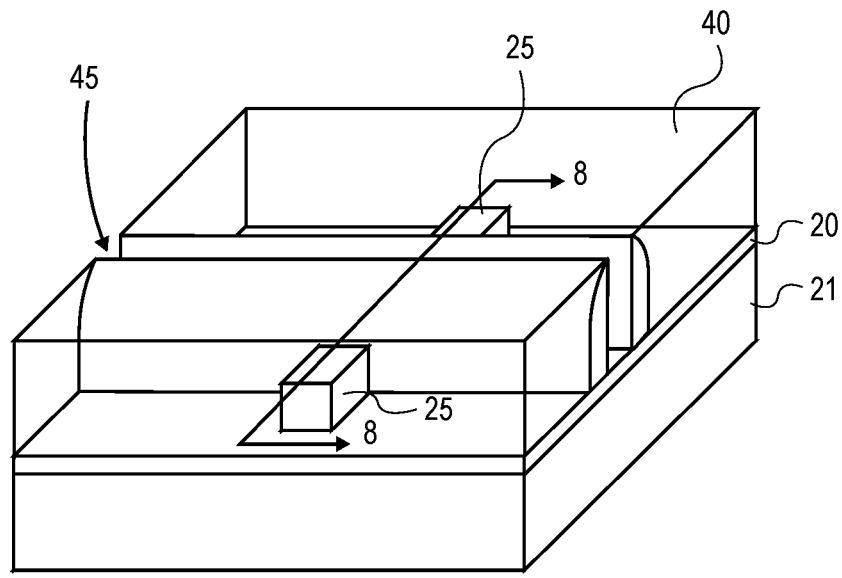
FIG. 7 illustrates the structure of FIG. 6, after removal of the dummy gate.
Figure 8:
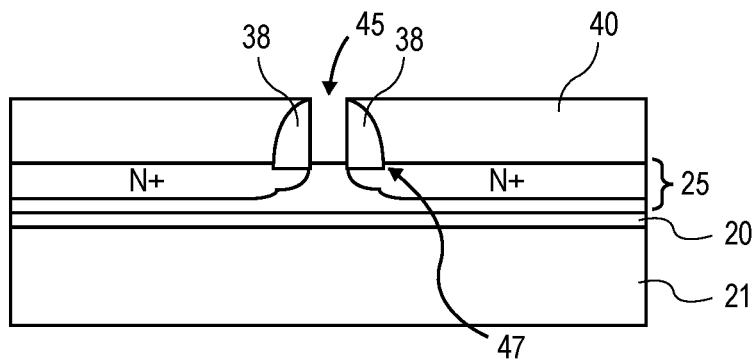
FIG. 8 is a cross-sectional, elevation view of the structure of FIG. 7 taken through section line 8-8 of FIG. 7.
Figure 9:
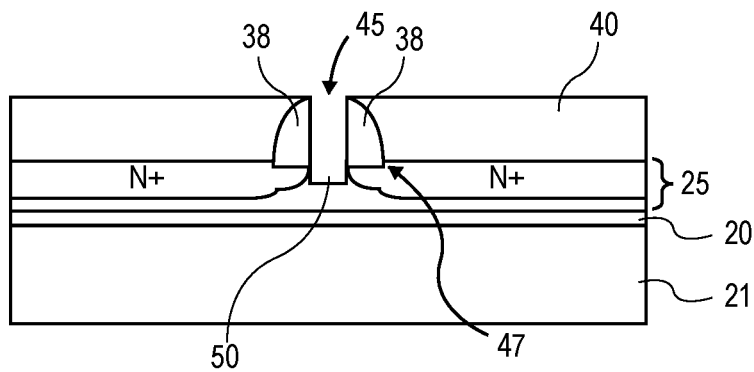
FIG. 9 illustrates the structure of FIG. 8, after an etching step which thins the channel region.

After the deposition and planarization of the dielectric layer 40, a wet etch is used to remove the dummy polysilicon gate 30, leaving the opening 45, as shown in FIG. 7. (The dummy gate oxide (not shown) is also removed.) The cross-sectional view of FIG. 8 taken through section line 8-8 of FIG. 7, better shows the opening 45. Also better shown in FIG. 8, is that the spacers 38 are recessed at 47 into the body 25. As mentioned earlier, after the source and drain tip implant and before the spacer material is deposited, an oxide layer is removed from the body 25. This results in the loss of some of the body material and, in part, accounts for the thinning occurring in the prior art structure shown at 11 of FIG. 1A. The removal of this oxide is important in some processes, as will be discussed later.

Following the removal of the dummy gate, any oxide over the body 25 within the opening 45 is removed in an ordinary cleaning step. Then, the structure of FIG. 8 is placed in a selective silicon bath such as NH$_4$OH which reduces the size of the body within the opening 45. This etching reduces both the height of the body as seen at 50 of FIG. 9, as well as the width of the body. This allows the channel region of the body 25 to be thinned to a target height and thickness. Again, assume that the target height and thickness of the body 25 in the channel region is 20×20 nm. A thicker and wider body 25 may be initially formed since it is thinned in this etching step. Importantly, this etching step does not thin the body 25 outside of the channel region. Consequently, if the body 25 is initially thicker and wider, the source and drain regions remain thicker or wider after the channel region has been thinned. Thus, by starting with a thicker and wider body, there is more silicon left after the cleaning process, and the severe thinning shown at 11 of FIG. 1A is avoided.

Next, a gate dielectric 60 is formed on exposed surfaces which includes the sides and top of the body 25 lying within the opening 45. The layer 60 also deposits on the interior sidewalls of the spacers 38 and on the upper surface of the dielectric layer 40. The gate dielectric, in one embodiment, has a high dielectric constant (k), such as a metal oxide dielectric, for instance, HfO$_2$ or ZrO$_2$ or other high k dielectrics, such as PZT or BST. The gate dielectric may be formed by any well-known technique such as atomic layer deposition (ALD) or chemical vapor deposition (CVD). Alternately, the gate dielectric may be a grown dielectric. For instance, the gate dielectric 60, may be a silicon dioxide film grown with a wet or dry oxidation process to a thickness between 5-50 Å.

Figure 10:
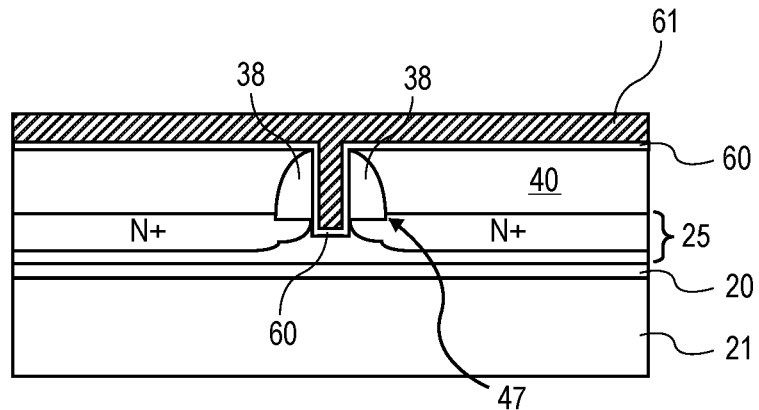
FIG. 10 illustrates the structure of FIG. 9, after forming a high-k gate insulating layer and a metal gate layer.

Following this, also as seen in FIG. 10, a gate electrode (metal) layer 61 is formed over the gate dielectric layer 60.

The gate electrode layer 61 may be formed by blanket deposition of a suitable gate electrode material. In one embodiment, a gate electrode material comprises a metal film such as tungsten, tantalum, titanium and/or nitrides and alloys thereof. For the n channel transistors, a work function in the range of 3.9 to 4.6 eV may be used. For the p channel transistors, a work function of 4.6 to 5.2 eV may be used. Accordingly, for substrates with both n channel and p channel transistors, two separate metal deposition processes may need to be used.

Figure 11:
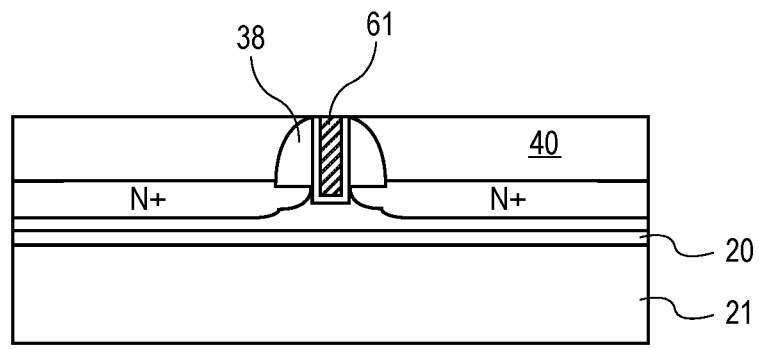
FIG. 11 illustrates the structure of FIG. 10 after planarization.

The metal layer 61 is planarized using, for example CMP, and the planarization continues until at least the upper surface of the dielectric layer 40 is exposed, as shown in FIG. 11.

Standard processing is now used to complete the transistor of FIG. 11.

Figure 12:
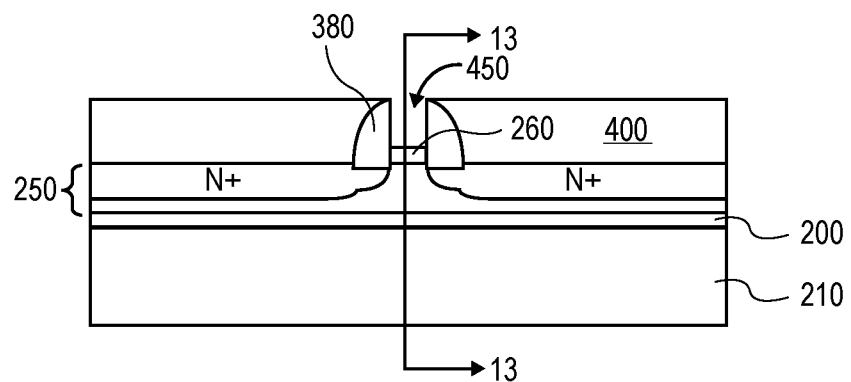
FIG. 12, which illustrates alternate processing, is a cross-sectional, elevation view, at a point in the processing similar to FIG. 8. In this alternate processing, a hard mask, used to define the silicon body, remains atop the channel region.
Figure 13:
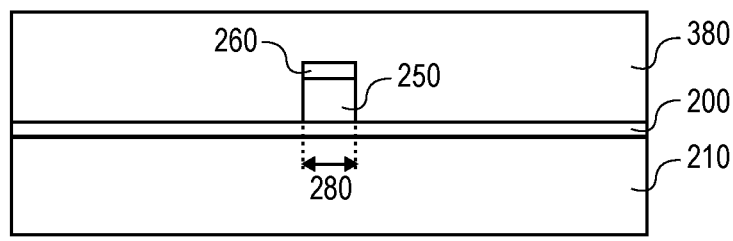
FIG. 13 illustrates the structure of FIG. 12, as viewed through the section lines 13-13 of FIG. 12.
Figure 14:
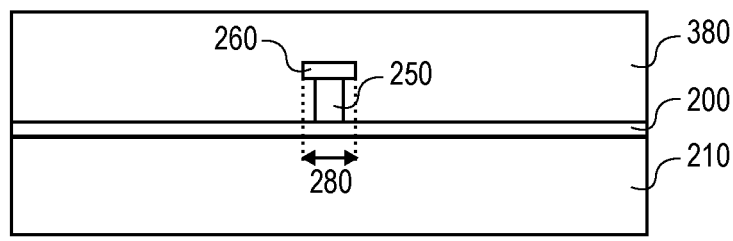
FIG. 14 illustrates the structure of FIG. 13, after etching which reduced the width of the body in the channel region.

Alternate processing is next described in conjunction with FIGS. 12-14. The numbering used in FIG. 12 includes a "0" after the numbers used in FIGS. 2-11 for corresponding layers and members. For instance, the spacers 38 of FIG. 11 are shown as spacers 380 in FIG. 12. In FIG. 12, a substrate 210, insulator 200 and body 250 are seen along with the source and drain regions.

The processing leading up to FIG. 12 is the same as the processing as in the prior embodiment, with one exception. This difference is that the hard mask defining the bodies or fins, such as body 250, is not immediately removed after defining the bodies. Rather, the polysilicon dummy gate structure is formed over the hard mask. Then, where the body is not protected by the polysilicon dummy gate, the hard mask is removed. Consequently, the hard mask 260 remains over the channel region, and after the spacers are formed and dummy gate removed, the hard mask 260 is exposed in opening 450 of FIG. 12.

The structure of FIG. 12 is again illustrated in FIG. 13 from the view taken through the lines 13-13 of FIG. 12. In this view, the silicon body 250 and mask 260 are shown with the spacer 380 in the background. The dimension 280 of FIG. 13 is the width of the body 250 in the channel region.

Wet etching is now used to etch the silicon body 250 with, for example, $NH_4OH$. This thins the width of the silicon body without changing its height, as shown in FIG. 14. Note, in FIG. 14 the remaining body 250 is narrower than its original dimension 280, while its height has not changed. For some semiconductor processes, better control may be obtained when only the width of the silicon body is etched. Thus, only the width of the body in the channel region is reduced to a predetermined target dimension, without reducing the height or width of the source and drain regions as this occurs.

After this etching step, the hard mask 260 is removed, then the high k dielectric and metal gates are formed, as was the case in the previous embodiment.

As mentioned earlier, the silicon dioxide layer, which typically is present on the silicon body, is removed before the deposition of the spacer material. This was discussed in conjunction with the recess 47 of FIG. 8. This is done because an undesirable reaction may occur between the oxide layer and the high k dielectric, if a high temperature anneal is used to activate the doping in the source and drain regions after the replacement gate is formed. At least the sides of the oxide layer, if not removed, may contact the high k dielectric and cause this problem. This is not a problem, however, if the annealing of the source and drain regions occurs before the high k dielectric is formed.

The thinning of the channel region described above can also be used on a planar, bulk transistor or a transistor formed in a delta-doped substrate. FIGS. 15-21 below describe the formation of a depletion mode transistor with raised source and drain regions, where controlled thinning of the channel region occurs.

Figure 15:
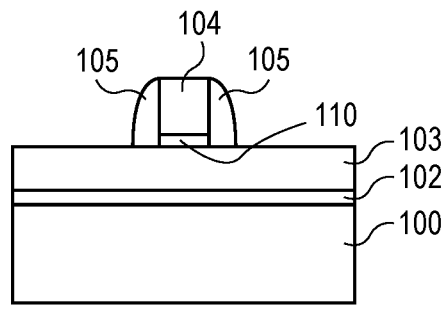
FIG. 15 is a cross-sectional, elevation view of a SOI substrate.

FIG. 15 illustrates an SOI substrate having a base 100, oxide layer 102 and a monocrystalline silicon layer 103. For the depletion mode transistor, the layer 103, or at least the region where the depletion mode transistor is fabricated, is lightly doped with an n type dopant or is intrinsic silicon, or other semiconductor material. A gate structure is fabricated on a dummy gate oxide layer 110. This structure comprises a polysilicon dummy gate 104 and spacers 105.

Figure 16:
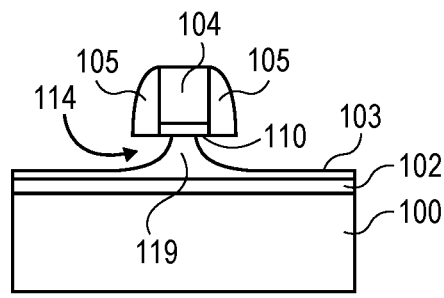
FIG. 16 illustrates the structure of FIG. 15, after etching of the silicon layer.

Following this, as shown in FIG. 16, the semiconductor layer 103 is etched isotropically in alignment with the gate structure. This etching undercuts the gate structure as illustrated at undercut 114. The remaining silicon from layer 103, is the channel region 119, seen in FIG. 16.

Raised source and drain regions are then epitaxially grown to establish a shallow, highly doped source/drain tip (extension) that laterally extends the distance under the gate edge to the channel region 119. Separate processing is used for the p-channel and n-channel transistors with each of the source and drain regions being grown in different processing, both with in-situ doping. This results in the source and drain regions being highly doped, in one case with a p-type dopant, and in the other case with an n-type dopant.

In forming a PMOS transistor, the source and drain regions are raised as illustrated. They may be formed by selectively depositing epitaxial boron (B) doped silicon or SiGe with germanium concentrations up to 30%, as an example. Under the processing conditions of 100 sccm of dichlorosilane (DCS), 20 slm $H_2$, 750-800° C., 20 Torr, 150-200 sccm HCl, a diborane ($B_2H_6$) flow of 150-200 sccm and a $GeH_4$ flow of 150-200 sccm, a highly doped SiGe film with a deposition rate of 20 nm/min, B concentration of 1E20 $cm^{-3}$ and a germanium concentration of 20% is achieved. A low resistivity of 0.7-0.9 mOhm-cm resulting from the high B concentration in the film provides the benefit of high conductivity in the tip source/drain regions and thereby reduced $R_{external}$. SiGe in the source/drain regions exerts compressive strain on the channel, which in turn results in enhanced mobility and improved transistor performance.

For an NMOS transistor, the source/drain regions are formed, for instance, using in-situ phosphorous doped silicon deposited selectively under processing conditions of 100 sccm of DCS, 25-50 sccm HCl, 200-300 sccm of 1% $PH_3$ with a carrier $H_2$ gas flow of 20 slm at 750° C. and 20 Torr. A phosphorous concentration of 2E20 $cm^{-3}$ with a resistivity of 0.4-0.6 mOhm-cm is achieved in the deposited film.

Figure 17:
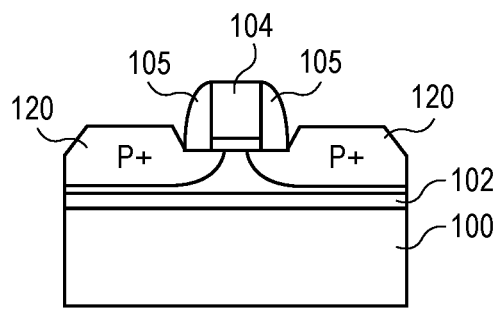
FIG. 17 illustrates the structure of FIG. 16, with epitaxially grown source and drain regions.
Figure 18:
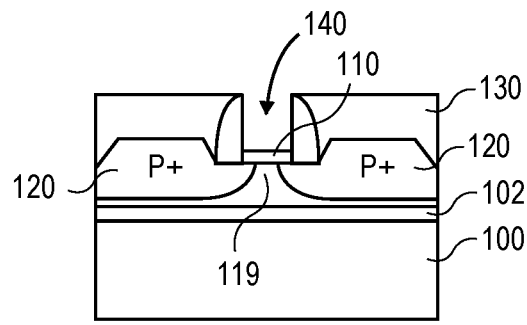
FIG. 18 illustrates the structure of FIG. 17, after a dielectric layer is formed around the structure and a gate region is exposed.

The resultant structure is shown in FIG. 17. Ion implantation of boron may be used to more heavily dope the source and drain region beyond the edges of the gate structure shown in FIG. 17.

Figure 19:
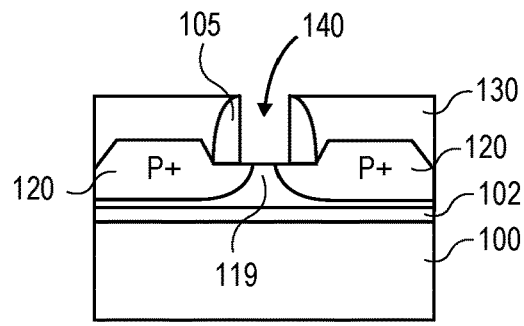
FIG. 19 illustrates the structure of FIG. 18, after additional etching.

A dielectric layer 130 is now formed over the structure of FIG. 17. This corresponds to the dielectric layers 40 and 400 in the prior embodiments. Again, this layer may be an ILD layer or a sacrificial layer. An etchant is used to etch away the dummy gate, providing an opening 140 seen in FIG. 18. This exposes the underlying oxide layer 110. The oxide layer 110 is removed with an ordinary etchant as shown in FIG. 19, thereby exposing the channel region 119.

Figure 20:
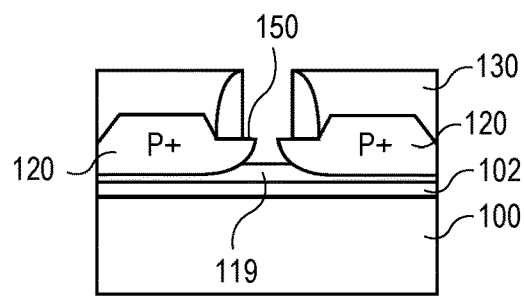
FIG. 20 illustrates the structure of FIG. 19, after etching, which thins the channel region.

Now, the channel region can be etched to reduce its cross section as shown in FIG. 20. A tetramethylammonium hydroxide (TMAH) or ammonium hydroxide solution with an appropriate pH value is used to selectively etch the exposed n type or intrinsic silicon channel region 119 without affecting the p+ source and drain regions. This etchant is highly selective, and thus leaves in place the tips 150 of the source and drain regions 120 while the thinning of the channel region 119 occurs. The boron-doped silicon has a sufficiently different lattice energy than the phosphorous- or arsenic-doped silicon, thereby allowing this selective etching to occur. In one process, this etching is done at a megasonic energy level of between 600 and 1100 kHz. The tips 150 shown in FIG. 20, thus remain even though the channel region falls below the raised source and drain regions.

A high k dielectric gate layer 122 may next be conformally deposited using, for instance, ALD. Following this, metal gate layer 124 is formed. The appropriate work function for the layer 124 is used as discussed above for the layer 61.

Figure 21:
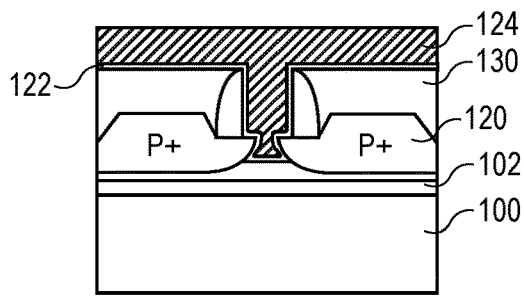
FIG. 21 illustrates the structure of FIG. 20, after forming an insulating, high-k layer, and a metal gate layer.
Figure 22:
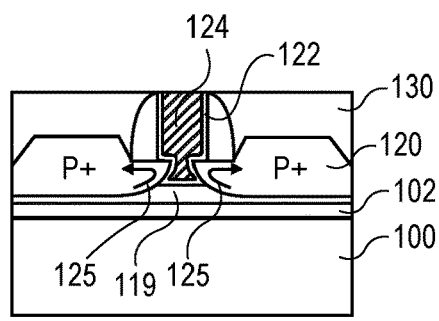
FIG. 22 illustrates the structure of FIG. 21, after planarization.

The structure of FIG. 21 is planarized with, for instance, CMP to provide the structure of FIG. 22. In the finished device, the final recessed channel 119 thus has raised, source/drain extension regions. This allows the current from the channel inversion layer to spread upward into these extension regions as shown by the lines 125. In contrast in examining FIG. 1B at 16, the current can only spread outward and downward, thereby resulting in higher series resistance.

Figure 23:
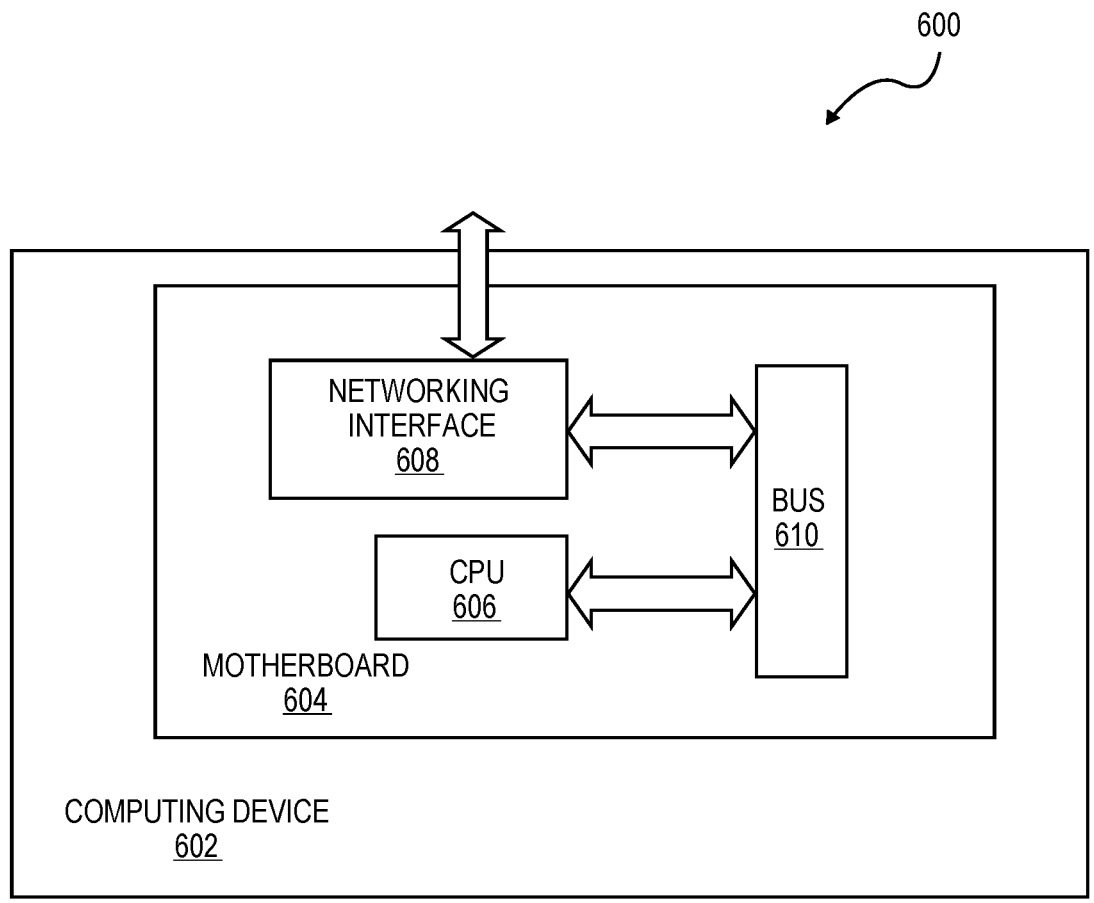
FIG. 23 is a block diagram, incorporating the above-illustrated thinned channel transistors in a system.

The transistor fabricated as described above may be incorporated into an integrated circuit, central processing unit, which in turn is part of a computing device or system. FIG. 23 illustrates such a system 600 in accordance with one embodiment. As illustrated, for the embodiment, system 600 includes computing device 602 for processing data. Computing device 602 may include a motherboard 604. Motherboard 604 may include in particular a processor 606, and a networking interface 608 coupled to a bus 610. More specifically, processor 606 may comprise the transistors of FIG. 11 or 22, as examples, of the above-described transistor.

Depending on the applications, system 600 may include other components, including but are not limited to, volatile and non-volatile memory, a graphics processor, a digital signal processor, a crypto processor, a chipset, mass storage (such as hard disk, compact disk (CD), digital versatile disk (DVD) and so forth), and so forth.

In various embodiments, system 600 may be a personal digital assistant (PDA), a mobile phone, a tablet computing device, a laptop computing device, a desktop computing device, a set-top box, an entertainment control unit, a digital camera, a digital video recorder, a CD player, a DVD player, or other digital device of the like.

Thus, improved processing has been described that allows a channel region to be controllably thinned, and that permits the source/drain regions to have less resistance.

What is claimed is:

1. An apparatus comprising:
   a first portion of a semiconductor body, wherein the first portion is under a gate electrode, and wherein the first portion has a first width, wherein the gate electrode is a tri-gate structure; and
   a second portion of the semiconductor body outside the gate electrode, wherein the second portion has a second width, wherein the second width is greater than the first width, and wherein the semiconductor body is a fin on a substrate; and
   a gate dielectric between the gate electrode and the semiconductor body, wherein the gate dielectric is a dual layer gate dielectric having a first structure and a second structure, and
   wherein the gate electrode has a work function in a range of 3.9 eV to 4.6 eV, and wherein the gate electrode is of an n-type device.

2. The apparatus of claim 1, wherein the second portion is closer to drain or source regions.

3. The apparatus of claim 2, wherein the source and drain regions comprise As or Ph.

4. The apparatus of claim 1, wherein the gate electrode includes a work function metal comprising: W, Ta, Ti, and N.

5. The apparatus of claim 1, wherein the substrate comprises Si.

6. The apparatus of claim 5, wherein the substrate comprises a delta-doped substrate.

7. The apparatus of claim 1, wherein the gate electrode is between a first spacer and a second spacer, and wherein the first and second spacers comprise N.

8. The apparatus of claim 1, wherein the gate dielectric comprises Hf and O.

9. The apparatus of claim 1, wherein the first structure comprises Si and O, and wherein the second structure comprises Hf and O.

10. The apparatus of claim 1, wherein the gate electrode has a work function in a range of 4.6 eV to 5.2 eV, and wherein the gate electrode is of a p-type device.

11. A system comprising:
    a memory;
    a processor; and
    a network interface coupled to the processor via a bus, wherein the processor is at least one of: a central processing unit (CPU); a graphics processor; a digital signal processor; or a crypto processor, wherein the memory comprises at least one of a volatile memory or non-volatile memory, and wherein the processor includes:
    a first portion of a semiconductor body, wherein the first portion is under a gate electrode, wherein the first portion has a first width, and wherein the gate electrode is a tri-gate structure; and
    a second portion of the semiconductor body outside the gate electrode, wherein the second portion has a second width, wherein the second width is greater than the first width, and wherein the semiconductor body is a fin on a substrate; and
    a gate dielectric between the gate electrode and the semiconductor body, wherein the gate dielectric is a dual layer gate dielectric having a first structure and a second structure, wherein the gate electrode has a work function in a range of 3.9 eV to 4.6 eV, and wherein the gate electrode is of an n-type device.

12. The system of claim 11, wherein the second portion is closer to drain or source regions.

13. The system of claim 12, wherein the source and drain regions comprise As or Ph.

14. The system of claim 11, wherein the gate electrode includes a work function metal comprising: W, Ta, Ti, and N.

15. The system of claim 11, wherein the substrate comprises Si.

16. The system of claim 11, wherein the gate electrode is between a first spacer and a second spacer, and wherein the first and second spacers comprise N.

17. The system of claim 11, wherein the gate dielectric comprises Hf and O.

18. The system of claim 11, wherein the first structure comprises Si and O, and wherein the second structure comprises Hf and O.

19. A method comprising:
  forming a first portion of a semiconductor body, wherein the first portion is under a gate electrode, wherein the first portion has a first width, and wherein the gate electrode is a tri-gate structure; and
  forming a second portion of the semiconductor body outside the gate electrode, wherein the second portion has a second width, wherein the second width is greater than the first width, and wherein the semiconductor body is a fin on a substrate; and
  forming a gate dielectric between the gate electrode and the semiconductor body, wherein the gate dielectric is a dual layer gate dielectric having a first structure and a second structure, wherein the gate electrode has a work function in a range of 3.9 eV to 4.6 eV, and wherein the gate electrode is of an n-type device.

20. The method of claim 19, wherein the second portion is closer to drain or source regions.

* * * * *